(12) United States Patent
Hattori et al.

(10) Patent No.: US 6,290,509 B1
(45) Date of Patent: Sep. 18, 2001

(54) ELECTRICAL CONNECTOR HOUSING

(75) Inventors: Yukimitsu Hattori; Takeharu Ito; Mitsuhiko Matsuoka; Akinori Oishi; Koji Kasai, all of Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 09/465,783

(22) Filed: Dec. 17, 1999

(30) Foreign Application Priority Data

Dec. 18, 1998 (JP) .................................................. 10-361431

(51) Int. Cl.⁷ .................................................. H01R 12/00
(52) U.S. Cl. .......................................... 439/76.2; 439/949
(58) Field of Search .................................. 439/76.2, 76.1, 439/85, 43, 514, 515, 714, 717, 721, 949

(56) References Cited

U.S. PATENT DOCUMENTS

| 5,057,026 | 10/1991 | Sawai et al. | 439/76 |
|---|---|---|---|
| 5,295,858 | 3/1994 | Kasai et al. | 439/404 |
| 5,624,280 | 4/1997 | Kato | 439/724 |
| 5,626,492 | 5/1997 | Onizuka et al. | 439/512 |
| 5,722,851 | * 3/1998 | Onizuka et al. | 439/404 |
| 5,805,402 | 9/1998 | Maue et al. | 361/93 |

FOREIGN PATENT DOCUMENTS

| 398734 | 3/1966 | (CH) . |
|---|---|---|
| 0354545 | 2/1990 | (EP) . |
| 5-55718 | 7/1993 | (JP) . |

* cited by examiner

*Primary Examiner*—Paula Bradley
*Assistant Examiner*—Ann McCamey
(74) *Attorney, Agent, or Firm*—Greenblum & Bernstein, P.L.C.

(57) ABSTRACT

The circuitry contained in an electrical connector housing is standardized, so that its manufacturing, modification and addition can be simplified. To this end, a circuitry is designed so as to include a plurality of unit circuits, both ends of which are to be connected to an electrical part such as a relay, fuse or connector. The unit circuits are made of an identical electrically conductive material and formed into long thin elements. The unit circuits are arranged in parallel at a given spacing relative to one another. The electrically conductive element of each unit circuit is connected to the electrical part through another electrically conductive element arranged substantially perpendicular thereto.

23 Claims, 6 Drawing Sheets

ELECTRICAL CONNECTOR HOUSING

BACKGROUND OF THE INVENTION

1. Field of the Invention

The present invention relates to electrical connector housings used for example in automobiles. More particularly, the electrical connector housing according to the present invention is used as a junction box that contains a plurality of branch circuits and on which electrical relays, fuses and electrical connectors can be mounted. In the electrical connector housing of the present invention, the circuit configuration can be standardized for making it easier to form circuitry and to respond to changes of the circuitry.

2. Description of Background Information

The automobile industry is continually searching for the most efficient way of reducing the costs of manufacturing wire harnesses used in automobiles. In this connection, it is very important to optimize the structural and wiring design of an electrical connector housing. This applies both to internal circuits and connector receptacles for receiving external terminals and as well as to a corresponding connector assembly including external terminals that fit into the connector receptacles.

Automobiles are filled with different kinds of electrical parts or electrical apparatuses, depending on their grades, types or models. Usually, the higher the grade of automobile is, the greater the number of circuits are used. In order to respond to the variations in this number of circuits as a function of the vehicle depending on grades, it is preferable to standardize structures of electrical connector housings, bus bars contained in the electrical connector housings, and connector assemblies received by connector receptacles of the electrical connector housings. These standardized elements can be used for all automobile grades and thus gain a wider use.

By contrast, the number of external terminals contained in a connector assembly is determined by the automobile's grade. Thus, a connector assembly contains only the number of external terminals necessary for a particular grade. For instance, for two different car grades of an identical model, the electrical connector housing, its bus bars and the connector assembly may be structurally standardized. The only difference is that some circuits for a connector assembly of high comfort apparatuses are not provided for the connector assembly of low grade cars. In this context, the low-grade connector assembly is not provided with the outer terminals sufficient to connect with all the available bus bars contained in the electrical connector housing.

Figure 1:
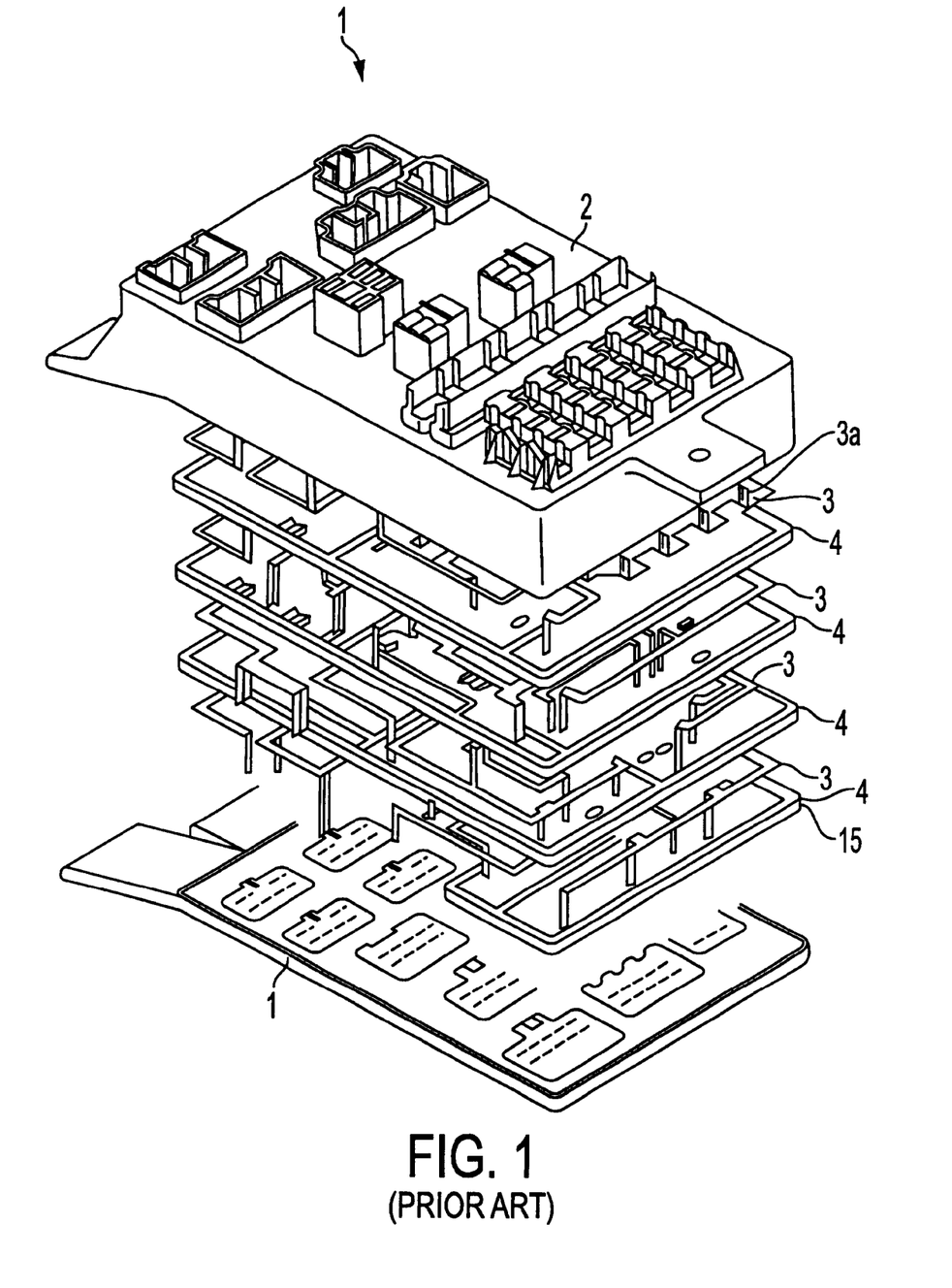
FIG. 1 is an exploded perspective view of a conventional electrical connector housing.
Figure 2A:
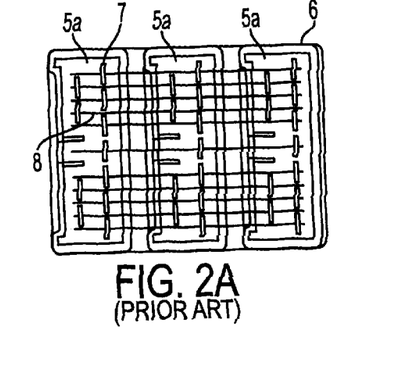
FIGS. 2(A)–2(D) are views of elements of a second conventional electrical connector housing.
Figures 2B, 2D:
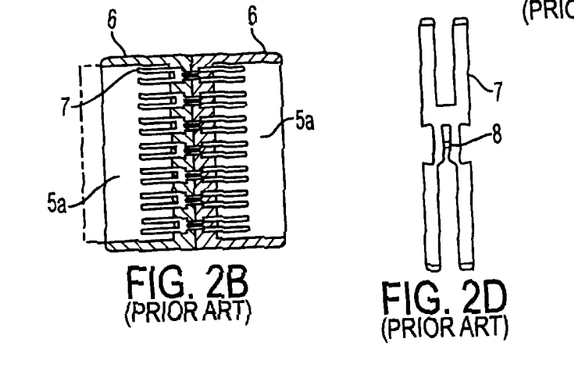
Figure 2C:
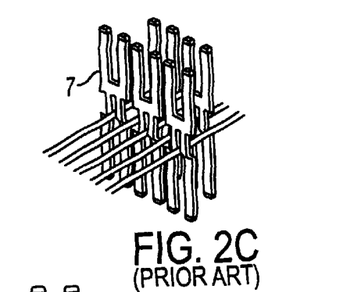

FIG. 1 shows an electrical connector housing conventionally used in automobiles. Such an electrical connector housing is a case consisting of a lower case 1 and an upper case 2. The case contains bus bars 3 and insulating plates 4 stacked in alternation. The bus bar 3 is made by stamping out a given form of circuitry from an electrically conductive plate, and includes a series of projecting tabs 3a. Relays, fuses or connectors are mounted in fitting units formed on the lower case 1 and/or the upper case 2. The tabs 3a are connected to electrical relays, fuses or connectors via transit terminals (not shown in the figures).

In some cases, coated conductive wires are used instead of bus bars 3 Press-fit contact members are then press-fitted to the coated conductive wires, and the coated conductive wires are connected to relays, fuses or connectors via transit terminals.

When bus bars are used, their design must be changed each time the routings need to be modified. The circuitry modification calls for change of molds used for bus bar manufacturing and thus incurs high costs. It is also difficult to respond quickly to circuit modifications or additions. Alternatively, when coated conductive cables or wires and press-fit contact members are used, the coated conductive cables have to be wired along a given routing. To this end, guiding members have to be provided on insulating plates or on the inner surface of the case. Accordingly, when circuitry is modified or added, the insulating plates and the case, as well as the molds for making them, have to be changed. The consequent need to make a new mold also incurs high costs, just as in the case of bus bars.

To solve these problems, standardized circuit elements have been developed, in which modifications or additions can easily be made (FIGS. 2(A)–2(D) and 3).

FIGS. 2(A)–2(D) show branch connection boxes designed by the present inventors and published as Japanese Utility Model HEI-5-55718. The branch connection boxes have two cases 6, 6 of an identical configuration, each including the same number of connector receptacles 5a in a surface and a rear surface opposite to the surface where the connector receptacles are provided. Cases 6 contain a plurality of bus bars 7 each one having an identical bifurcate fork-shape symmetrical about its longitudinal center axis. The two cases 6, 6 are then engaged back to back, i.e., the rear surfaces face each other so that the connector receptacles 5a face in opposite directions. The bus bars 7 are then mounted into the cases 6, 6 such as to be aligned parallel to one another. Subsequently, electrical cables 8 are pressed into the center portion of bifurcate fork shape bus bars 7, so that the bus bars 7 and the electrical cables 8 are electrically connected.

Figure 3:
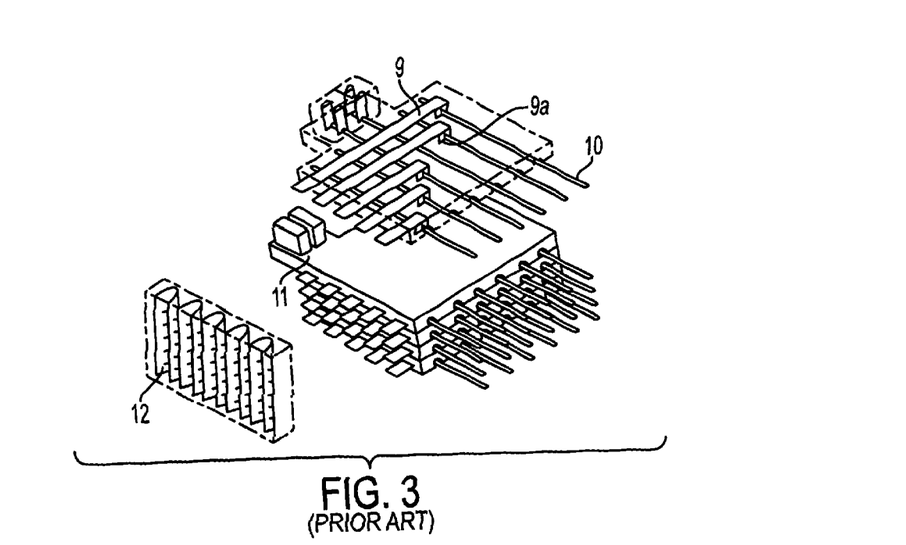
FIG. 3 is an exploded perspective view of a third conventional electrical connector housing.

FIG. 3 shows an electrical connection box disclosed in U.S. Pat. No. 5,057,026. In this box, bus bars 9 have a fixed narrow width, and are arranged in parallel. The bus bars 9 are provided, at given positions, with tabs 9a including contact blades. Electrical cables 10 are aligned in a direction perpendicular to the bus bars 9 and connected thereto by pushing down into the contact blades. Bus bars 9 and electrical cables 10 thus form a planar circuit stackable on an insulating plate 11, and a plurality of such units are formed into a layered structure. A connector assembly 12 is arranged nearby alongside the layered structure. The layers of bus bars 9 are then connected to one another through the connector assembly 12.

In the branch connection boxes shown in FIGS. 2(A)–2(D), a connector assembly is fitted into a corresponding connector receptacle 5a. When the connector assembly is not provided with a sufficient number of outside terminals, as is the case of low-grade connector assemblies, a considerable number of bus bars 7 may be left unconnected to any outside terminal and thus not used as circuits. Further, the space for containing connectors is limited, so that, when the number of circuits is increased, the width of the case must be broadened. It then becomes more difficult to produce higher density circuitry.

In the electrical connection box shown in FIG. 3, the lengths of bus bars 9 are determined beforehand, and the bus bars are aligned in parallel at given positions. The bus bars 9 are then connected to electrical cables by cramping to form circuits. This process requires several process steps and many connection sites, thus making their production complex. Besides, as a connector assembly 12 is needed for connecting the layers of bus bars 9, specific parts have to be prepared. Such complicated process steps and the provision of specific parts incur a high production cost.

SUMMARY OF THE INVENTION

The present invention has been provided to solve the above-mentioned problems. According to the electrical connector housing of the present invention, electrically conductive elements for forming all circuits can be made of the same material, thus making it simpler and more inexpensive to produce circuit materials. Furthermore, it is easy to modify or add circuits, assembly work is simplified, and the number of parts is reduced.

To this end, there is provided an electrical connector housing including a plurality of unit circuits. The plurality of unit circuits are made of first electrically conductive elements made of the same material and formed into the shape of long thin strips. The first electrically conductive elements are arranged in parallel at given intervals, and connected to electrical parts, such as electrical relays, fuses or connectors, through second electrically conductive elements. The second electrically conductive elements are also formed as long thin strips and arranged in a direction substantially perpendicular to a longitudinal direction of the first electrically conductive elements. The first and second electrically conductive elements respectively have intersection faces including contact points between the first and the second electrically conductive elements.

Preferably, the first electrically conductive elements and the second electrically conductive elements are made of the same material. Further, the first electrically conductive elements have an identical length, whereas the second electrically conductive elements have a variety of lengths according to the distance between the electrical parts and the first electrically conductive elements. Each of the second electrically conductive elements is used after having been cut out into a given length.

Typically, at least one of the first electrically conductive elements and the second electrically conductive elements have an insulating film adhered or coated thereon on at least the intersection face including the contact points. The insulating film is stripped off at the contact points. Thus, electrical contact points are formed between the first and the second electrically conductive elements. Thereafter, the electrical contact points are bonded.

There is also provided an electrical connector housing, wherein the plurality of unit circuits are divided into divisions and mounted in layers, and the electrical parts, such as an electrical relay, fuse or connector are mounted sideways onto each of the layers including one of the divisions of the plurality of unit circuits, such that the second electrically conductive elements cross the first electrically conductive elements at substantially right angles, and are connected thereto. Additionally, the first and the second electrically conductive elements may be formed by bus bars.

When the electrically conductive elements are previously adhered or coated with an insulating film, the coating process as described above for bus bars may not be required.

The first electrically conductive elements or the second electrically conductive elements, adhered or coated with an insulating film on at least the intersection faces including the contact points, may be formed by electrical wires, or a flexible printed circuit on which electrically conductive elements made of copper foils or bare conductive wires.

A unit circuit is defined as an electrically conductive element, a terminal of which is connected to a relay, fuse or connector. There is therefore no need to connect these unit circuits to one another. Accordingly, the connector assembly 12 for connecting bus bars 9 therebetween, shown in FIG. 3, is no longer needed. When circuitry is modified or supplemented, the corresponding first electrically conductive element, arranged in parallel to other elements, may be removed or added. Thereafter, a newly arranged electrically conductive element is connected to a given relay, fuse or connector through a perpendicularly-arranged second electrically conductive element. Circuit modification or additions can thus easily be made.

The first electrically conductive elements used for unit circuits have an identical length and are arranged in parallel. The first electrically conductive elements are connected to electrical parts, such as electrical relays, fuses or connectors, through perpendicularly-arranged second electrically conductive elements. The second electrically conductive elements have a variety of lengths depending on the distance between the first electrically conductive elements and electrical parts connected thereto. Preferably, the first electrically conductive elements used for unit circuits and the second electrically conductive elements used for connecting to electrical parts are made of an identical material.

Preferably, the second electrically conductive elements are used after they have been prepared by cutting off the material at given lengths.

As mentioned above, the first electrically conductive elements are disposed in parallel as unit circuits, and the second electrically conductive elements for connecting to electrical parts which are arranged perpendicular thereto, are made of the same material. Furthermore, the first electrically conductive elements can be made in an identical length by simply cutting off the material at a fixed specific length. Likewise, the second electrically conductive elements can be prepared by simply cutting off different lengths of the material. Accordingly, circuit elements can be prepared very easily at a low cost.

The first electrically conductive elements used for unit circuits, and the second electrically conductive elements for connecting to electrical parts, such as relays, fuses or connectors, may be formed, for instance, by bus bars or electrical wires or cables, as well as by flexible printed circuits (FPCs), whose conductive portions are made of copper foils or bare conductive wires or cables.

Typically, when bus bars are used as both of the first and second electrically conductive elements and intersect with each other, at least one of those bus bars is covered with an insulating coating at their intersection face. Subsequently, the bus bars are stripped of insulating coatings at their contact points, and are bonded by resistance, ultrasonic or laser welding, soldering or by direct binding means such as riveting. The bus bars are thus connected to each other.

Alternatively, the first electrically conductive elements used for unit circuits and the second electrically conductive elements for connecting to electrical parts may be electrical wires or cables. When making connection on the intersection faces, both electrical wires may be connected by using press-fit contact members serving as electrical terminals. When an FPC is used, insulating coatings are stripped off at the contact points, so that copper foils or the conductive wire cores are exposed for subsequent welding.

Upon being arranged in parallel, the unit circuits may be divided and mounted in several layers. Electrical parts, such as relays, fuses and connectors, which are to be mounted sideways into the electrical connector housing, may then be connected to the first electrically conductive elements of the unit circuits. A division of the first electrically conductive elements is assembled on each layer, and second electrically conductive elements for connecting to electrical parts cross the first electrically conductive elements substantially at right angles.

With reference to foregoing, the present invention includes an electrical connector housing including a plurality of unit circuits. The plurality of unit circuits are made of first electrically conductive elements formed into the shape of long thin strips. The first electrically conductive elements are arranged in parallel at given intervals, and connected to electrical parts through second electrically conductive elements. The second electrically conductive elements are also formed as long thin strips and arranged in a direction substantially perpendicular to a longitudinal direction of the first electrically conductive elements. The first and second electrically conductive elements forms intersection faces including contact points between the first and the second electrically conductive elements.

In another aspect of the present invention, the first electrically conductive elements and the second electrically conductive elements are made of the same material. The first electrically conductive elements have an identical length. The second electrically conductive elements have a variety of lengths according to the distance between the electrical parts and the first electrically conductive elements. Each of the second electrically conductive elements is used after having been cut out into a given length.

According to another aspect of the present invention, at least one of the intersection faces of the first and second electrically conductive elements is provided with an insulating film. The insulating film is removed at the contact points so as to form electrical contact points between the first and the second electrically conductive elements. The electrical contact points are bonded.

Another aspect of the present invention, the plurality of unit circuits are divided into divisions and mounted in layers. The electrical parts are mounted sideways. Each of the layers includes one of the divisions of the plurality of unit circuits.

Another aspect of the present invention, the first and second electrically conductive elements are formed by bus bars.

Another aspects of the present invention, at least one of the first and the second electrically conductive elements provided with an insulating film, is formed by one of electrical wires and a flexible printed circuit on which copper foils or bare conductive wires are mounted.

In another aspect of the invention, there is further provided an electrical connector housing including a plurality of unit circuits. The unit circuit is defined as a portion of a total circuit housed in the electrical connector housing. Only terminals of the unit circuit are connected to electrical components, such as relays, fuses and connectors. First electrically conductive elements are formed as long thin strips arranged in parallel at a given interval. Each of the first electrically conductive elements corresponds to the unit circuit. Second electrically conductive elements are also formed as long thin strips and arranged substantially perpendicular to the first electrically conductive elements. One end of the second electrically conductive element is connected to the electrical component. The second electrically conductive element is contacted to at least one of the first electrically conductive elements at a contact point.

The first electrically conductive elements may have an identical length, while the second electrically conductive elements may have a variety of lengths according to distances between the electrical components and the first electrically conductive elements connected to the second conductive elements.

Each contact position of the first and second electrically conductive element is connected by at least one of welding, soldering and riveting.

BRIEF DESCRIPTION OF THE DRAWINGS

The above and the other objects, features and advantages of the present invention will be made apparent from the following description of the preferred embodiments, given as non-limiting examples, with references to the accompanying drawings, in which:

FIGS. 9(A)–9(B) show a third embodiment of the present invention in which electrical wires are used, where FIGS. 10(A)–10(B) show a fourth embodiment of the present invention in which an FPC is used, where

DETAILED DESCRIPTION OF THE PREFERRED EMBODIMENTS

Figure 4:
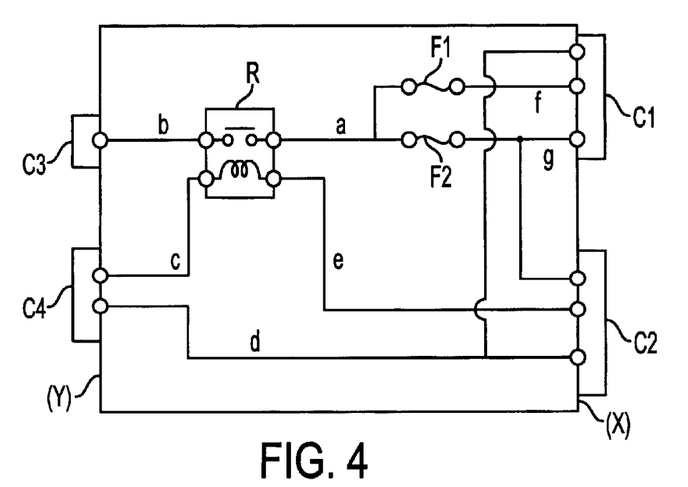
FIG. 4 is a view of an example of circuitry contained in an electrical connector housing.

FIG. 4 is an example of typical circuitry included in an electrical connector housing. In FIG. 4, C1 and C2 indicate connectors mounted in connector receptacles provided at a first surface (X side) of the case consisting of a lower case and an upper case, while C3 and C4 represent connectors mounted in connector receptacles provided at a second surface (Y side) of the case, which is opposite to the X side. Likewise, R represents a relay mounted in a relay receptacle provided at the X side of the case, while F1 and F2 represent fuses mounted in fuse receptacles provided at the Y side of the case.

The circuitry of FIG. 4 includes unit circuits "a" to "g". Each of the unit circuits is defined as a circuit having one end connected to one of the relay, fuse or connector, and the other end connected to another one of the relay, fuse or connector. For example, unit circuit "a" shown in FIG. 4 has one end connected to relay R, and the other end that is divided into two branches, one of which is connected to fuse F1 and the other to fuse F2. Unit circuit "b" has one end connected to connector C3 and the other end connected to relay R. Unit circuit "c" has one end connected to connector C4 and the other end connected to relay R. Unit circuit "d" has one end connected to connector C4 and the other end that is divided into two branches, one of which is connected to connector C2 and the other is connected to connector C1. Likewise, in unit circuits "e", "f" and "g", both ends are connected to either a connector, a relay or a fuse.

Figure 5:
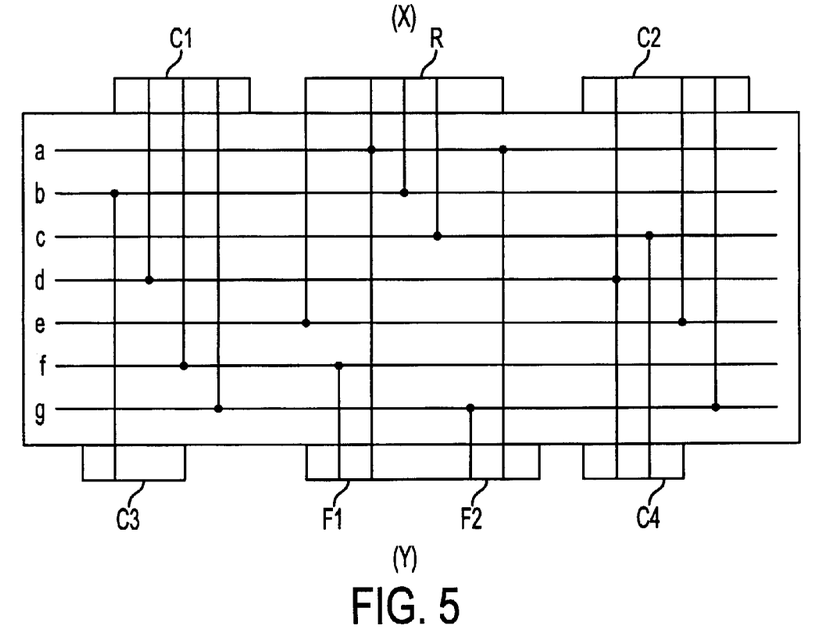
FIG. 5 shows a connection design of a circuitry contained in an electrical connector housing according to the present invention.
Figure 6:
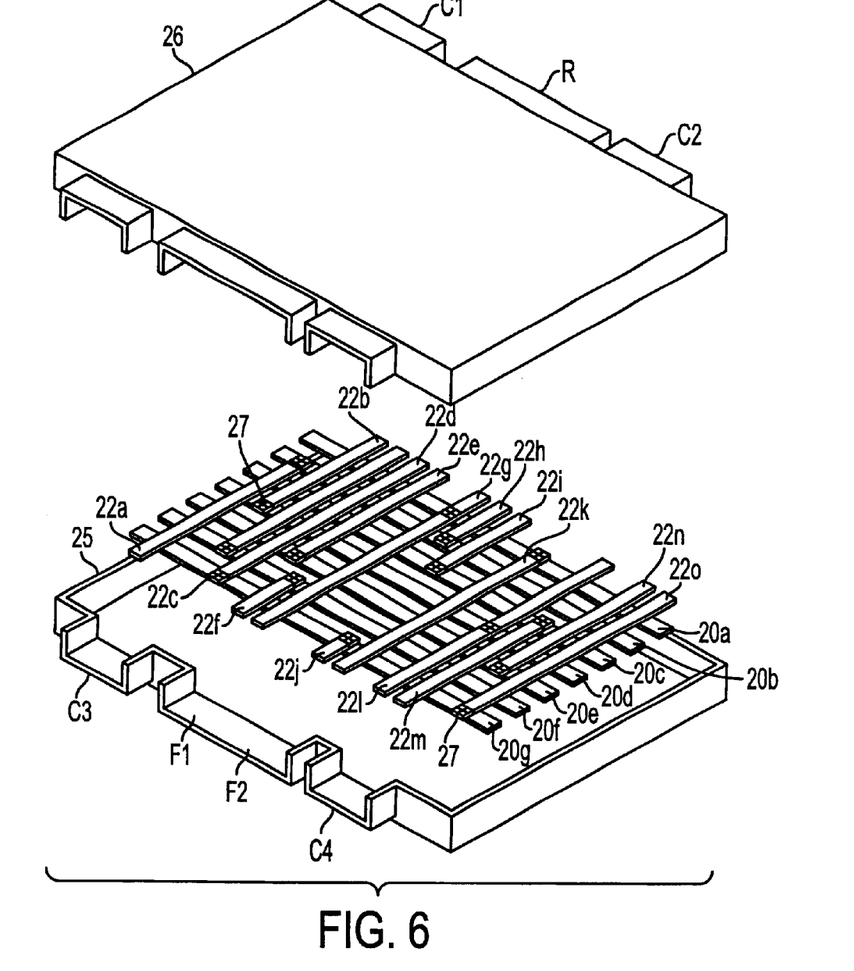
FIG. 6 is an exploded perspective view of an electrical connector housing containing a circuitry corresponding to FIG. 5.

The above-mentioned circuitry can be implemented as shown in FIGS. 5 and 6 in the following manner. Unit circuits "a" to "g" correspond to first electrically conductive elements, e.g., bus bars 20a to 20g, respectively, each of which has an identical length with a narrow width. The bus bars 20a to 20g are arranged in parallel at a given pitch, and are contained in an electrical connector housing having a lower case 25 and an upper case 26. The bus bars 20a to 20g are longitudinally aligned in parallel and substantially perpendicular to the direction in which a connector, relay or fuse is mounted.

Second electrically conductive elements for connecting to electrical parts such as connectors, relays and fuses, can be made of the same bus bar material used for bus bars 20a to 20g. This material is then cut off at a required length to yield bus bars 22a to 22o.

In FIG. 6, most of bus bars 22a to 22o are connected to one of the bus bars 20a to 20g at one end. In some cases, in order to raise wiring efficiency, bus bars 22a to 22o may be connected to one of the bus bars 20a to 20g at a middle portion of their length, as in the case of bus bars 22g and 22l. Thus, the bus bars 20a to 20g respectively constitute unit circuits "a" to "g", in connection with selected ones of bus bars 22a to 22o.

The upper face of each of bus bars 20a to 20g may be adhered or coated with an insulating film 21. The insulating film 21 is then locally cut away at the points where bus bars 20a to 20g intersect with bus bars 22a to 22o. Through these interconnections, bus bars 20a to 20g are led to a connector, relay or fuse. In such a case, bus bars 22a to 22o are not required to be adhered nor coated with any insulating film.

Alternatively, bus bars 22a to 22o, instead of bus bars 20a to 20g, may be adhered or coated with an insulating film. Their connecting points with bus bars 20a to 20g may then be stripped of the insulating film. In such a case, the bus bars 20a to 20g for unit circuits are not required to be adhered nor coated with any insulating film.

Figure 7:
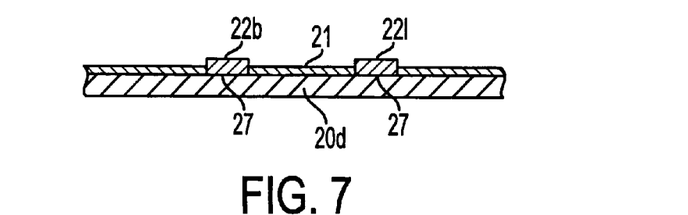
FIG. 7 is a schematic cross-sectional view of the contact points of the present invention, when the first electrically conductive elements used for unit circuits are connected to the second electrically conductive elements for connecting to electrical parts.

When, for instance, bus bars 20a to 20g for unit circuits are adhered or coated with an insulating film 21, bus bars 22a to 22o for connecting to electrical parts are arranged to cross over bus bars 20a to 20g substantially at a right angle, with the insulating film 21 interposed therebetween. Although the length of each of bus bars 22a to 22o may be different, they are aligned parallel to one another. The insulating film 21 is then removed from each of bus bars 20a to 20g at their intersection face with selected ones of bus bars 22a to 22o so as to form unit circuits "a" to "g". An end portion of each of bus bars 22a to 22o (except for some bus bars such as 22g and 22l shown in FIG. 6 as an example) is then put into contact with the corresponding exposed face portion of bus bars 20a to 20g. As for the bus bars 22g and 22l, their middle portions are connected with bus bars 20a and 20d in the same manner, respectively. As shown in FIG. 7, the contacted portions are then bonded by resistance welding 27 and electrically connected together. Bus bars 22g and 22l are set to be long enough to span across bus bars 20a to 20g and their middle portions are resistance-welded respectively to the insulating film-free portions of bus bars 20a and 20d. The technique for connecting bus bars 20a to 20g to bus bars 22a to 22o is not limited to the above-mentioned resistance welding, but also includes ultrasonic welding, laser welding, soldering or riveting etc.

The other end portion of each of bus bars 22a to 22o is connected either to connector C1, C2, C3 or C4, or to relay R, or to fuse F1 or F2.

Figure 8:
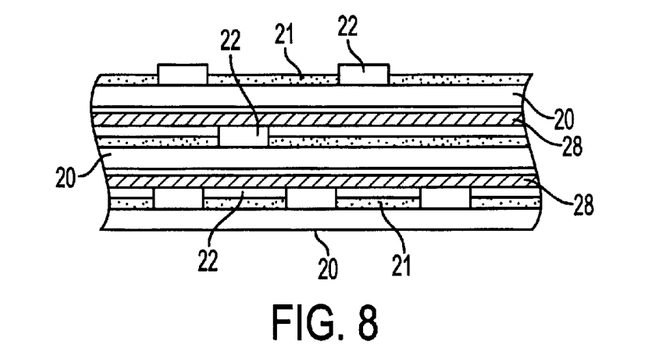
FIG. 8 is a schematic cross-sectional view of a second embodiment of the invention, in which unit circuits are stacked in layers.

FIG. 8 shows a second embodiment of the present invention. As shown in this figure, when the number of unit circuit bus bars to be mounted on a single layer increases, the bus bars may be divided and loaded onto several layers. The layers are subsequently superposed on one another. In this case, insulating plates 28 are interposed between layers. When whole surfaces of both of bus bars 20a to 20g and bus bars 22a to 22o are coated with insulating films, insulating plates 28 may not be required.

Figures 9A, 9B:
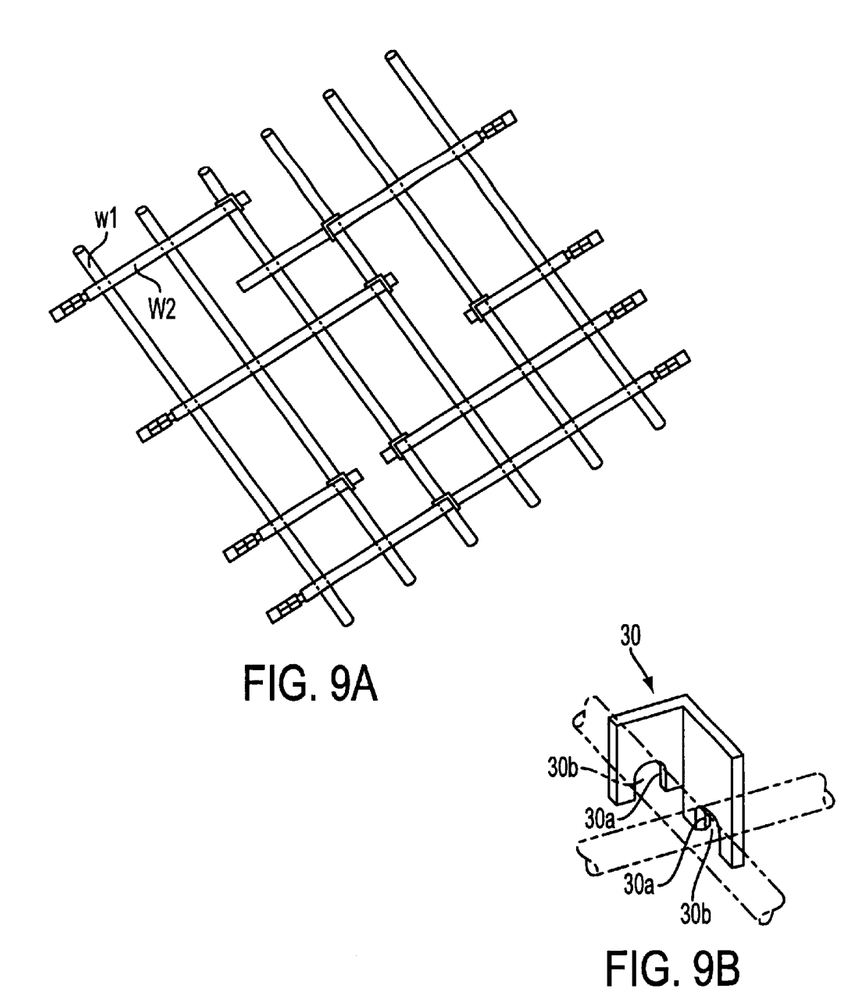
FIG. 9(A) is a schematic perspective view of an entire circuit.
FIG. 9(B) shows a cross-fix configuration when electrical wires are connected by means of a press-fit contact member.

FIGS. 9(A) and 9(B) show a third embodiment in which first electrically conductive elements used as unit circuits, and second electrically conductive elements used for connecting to electrical parts, are both formed by coated conductive wires connected by means of press-fit contact members 30. Each of the press-fit contact members 30 has an L-shaped horizontal cross-section (viewed from the top, as depicted in FIG. 9(B)). They may have a different length of cross-section, and at their bottom portion slots 30b are provided with press-fit contact blades 30a. The press-fit contact blades 30a connect the first coated conductive wires w1 (used as unit circuits) to the second coated conductive wires w2 (used for connecting to electrical parts) by applying a downward pressing force.

Figure 10A:
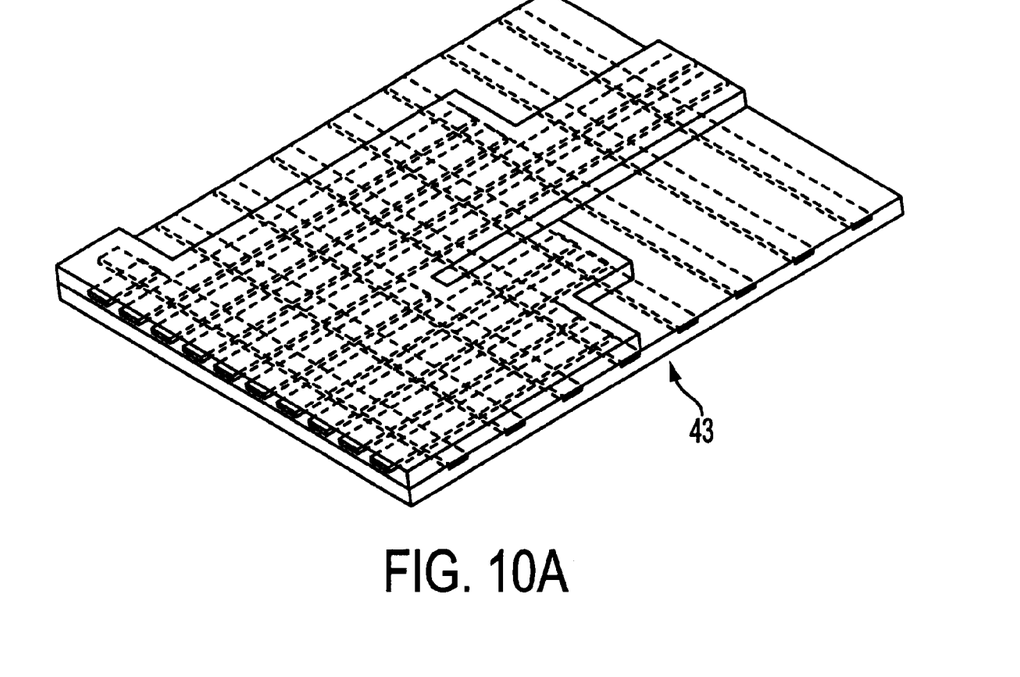
FIG. 10(A) is a schematic perspective view of an entire circuit.
Figure 10B:
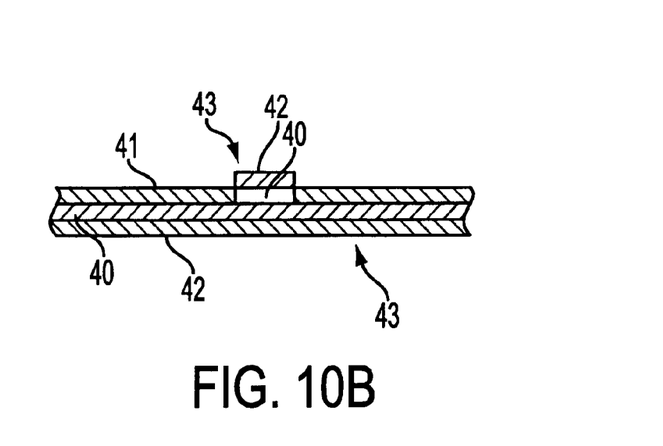
FIG. 10(B) is an enlarged cross-sectional view of a contact point between the first and the second electrically conductive elements.

FIGS. 10(A) and 10(B) show a fourth embodiment, in which a flexible printed circuit (FPC) 43 serves to form the first electrically conductive elements used as unit circuits, and the second electrically conductive elements used for connecting to electrical parts. The FPC 43 is prepared by arranging copper foils or bare conductive wires in parallel to form electrically conductive elements 40, and by coating both faces thereof with insulating films 41 and 42. When used as unit circuits, the electrically conductive elements 40 having an identical length are formed as an FPC 43, and the FPC 43 is cut into rectangular shapes. Further, the insulating films are cut away at the connection points. When used for connecting to electrical parts, the FPC 43 is cut off so that each of electrically conductive elements 40 has a desired length. When the FPC 43 is used, the first and the second electrically conductive elements 40 are bonded by resistance welding or the like, and are thus connected to each other.

Although not shown in figures, when an electrical connector housing contains several layers, the layers may include several types of circuitry, depending on the intensity in which electric current flows intensity of the electric current flowing in the circuitry. For instance, the housing may contain a first layer wired with bus bars, a second layer wired with electrical wires or cables, and a third layer wired with FPC. Further, the electrically conductive elements used as unit circuits, and those used for connecting to electrical parts, can be made of the same materials. For example, the first electrically conductive elements used as unit circuits may be formed from an FPC, whereas the second electrically conductive elements used for connecting to electrical parts may be electrical wires or cables. Then, end portion of electrical wires or cables may then be stripped of insulating films, and the conductive portion thus exposed may be welded to the conductive portion (portion whose insulating film is stripped off) of the FPC.

According to the invention, unit circuits are prepared by previously initially arranging first electrically conductive elements having an identical length in parallel. To connect electrical parts, such as connectors, relays and fuses, to the first electrically conductive elements (unit circuits), second electrically conductive elements are simply set up traverse to the first electrically conductive elements at substantially at a right angle. By virtue of this configuration, the circuitry is simplified, and the number of connection points can be reduced.

When circuitry is modified or supplemented, an electrically conductive element as a unit circuit may simply be removed or added, and the modified or added element can easily be connected to an electrical part through a second electrically conductive element. Electrically conductive elements can thus be modified or added simply. Moreover, circuit addition does not require a large space. Therefore, the electrical connector housing of the invention can be kept reasonably small.

Although the electrical connector housing may have a multi-layered structure, connections between layers are not necessary, thus, the number of parts can be reduced. Further, electrically conductive elements used as unit circuits and those used for connecting to electrical parts can be made of the same material. Accordingly, these elements can be prepared by simply cutting this material into given lengths. They can thus be produced easily and at a low cost. The cost reduction brought about by virtue of by this manufacturing method is very large.

Although the invention has been described with reference to particular means, materials and embodiments, it is to be understood that the invention is not limited to the particulars disclosed and extends to all equivalents within the scope of the claims.

The present disclosure relates to subject matter contained in priority Japanese Application No. HEI 10-361431, filed on Dec. 18, 1998, which is herein expressly incorporated by reference in its entirety.

What is claimed:

1. An electrical connector housing comprising:
   a plurality of unit circuits made of a plurality of first electrically conductive elements formed as long thin strips arranged in parallel at a given interval and a plurality of second electrically conductive elements, each of said first electrically conductive elements configured to connect to electrical parts through said plurality of second electrically conductive elements;
   said second electrically conductive elements formed as long thin strips and arranged in a direction substantially perpendicular to the direction of said first electrically conductive elements;
   said first and second electrically conductive elements forming intersection faces including contact points to electrically connect between said first and said second electrically conductive elements,
   wherein each of said plurality of unit circuits is formed by one of said plurality of first electrically conductive elements and at least one of said plurality of second electrically conductive elements that connects said one of the plurality of first electrically conductive elements with at least two of the electrical parts, and
   wherein only ends of said second electrically conductive elements communicate with an exterior of said housing for connection with the electrical parts.

2. The electrical connector housing according to claim 1, wherein said plurality of unit circuits is divided into divisions and mounted in layers, and said electrical parts are mounted sideways of said layers, each of said layers comprising one of said divisions of said plurality of unit circuits, each of said unit circuits being placed in one of the layers without connection between the layers.

3. The electrical connector housing according to claim 1, wherein said first and said second electrically conductive elements are formed by bus bars.

4. The electrical connector housing according to claim 1, wherein said first electrically conductive elements and said second electrically conductive elements are made of an identical material, wherein said first electrically conductive elements are standardized elements having a substantially identical length, and said second electrically conductive elements have a variety of lengths according to distances between said electrical parts and said first electrically conductive elements forming unit circuits, and wherein said second electrically conductive elements are used after having been cut out into given lengths and configured according to a configuration of a product on which said electrical connector housing is mountable.

5. The electrical connector housing according to claim 4, wherein said plurality of unit circuits is divided into divisions and mounted in layers, and said electrical parts are mounted sideways of said layers, each of said layers comprising one of said divisions of said plurality of unit circuits, each of said unit circuits being placed in one of the layers without connection between the layers.

6. The electrical connector housing according to claim 4, wherein said first and said second electrically conductive elements are formed by bus bars.

7. The electrical connector housing according to claim 1, wherein at least one of said intersection faces of said first and second electrically conductive elements is provided with an insulating film, wherein said insulating film is removed at said contact points so as to form electrical contact points between said first and said second electrically conductive elements, and wherein said electrical contact points are bonded.

8. The electrical connector housing according to claim 7, wherein said first and said second electrically conductive elements are formed by bus bars.

9. The electrical connector housing according to claim 7, wherein said at least one of said first and said second electrically conductive elements provided with an insulating film, is formed by one of electrical wires and a flexible printed circuit on which one of copper foils and bare conductive wires are mounted.

10. The electrical connector housing according to claim 4, wherein at least one of said intersection faces of said first and second electrically conductive elements is provided with an insulating film, wherein said insulating film is removed at said contact points so as to form electrical contact points between said first and said second electrically conductive elements, and wherein said electrical contact points are bonded.

11. The electrical connector housing according to claim 10, wherein said first and said second electrically conductive elements are formed by bus bars.

12. The electrical connector housing according to claim 10, wherein said at least one of said first and said second electrically conductive elements provided with an insulating film, is formed by one of electrical wires and a flexible printed circuit on which one of copper foils and bare conductive wires are mounted.

13. The electrical connector housing according to claim 7, wherein said plurality of unit circuits is divided into divisions and mounted in layers, and said electrical parts are mounted sideways of said layers, each of said layers comprising one of said divisions of said plurality of unit circuits, each of said unit circuits being placed in one of the layers without connection between the layers.

14. The electrical connector housing according to claim 13, wherein said at least one of said first and said second electrically conductive elements provided with an insulating film, is formed by one of electrical wires and a flexible printed circuit on which one of copper foils and bare conductive wires are mounted.

15. An electrical connector housing including a plurality of unit circuits, comprising:
   first electrically conductive elements formed as long thin strips arranged in parallel at a given interval, each of said first electrically conductive elements being configured to form a part of one of the unit circuits, the unit circuit being configured as a portion of a total circuit housed in said electrical connector housing, each end of the unit circuit connecting to an electrical component;
   second electrically conductive elements formed as long thin strips arranged substantially perpendicular to the longitudinal direction of said first electrically conductive elements, one end of each of said second electrically conductive elements being directly connected to said electrical component placed at a side of the electrical connector housing; and
   each of said second electrically conductive elements electrically contacting one of said first electrically conductive elements;
   wherein each of said plurality of unit circuits is formed by one of said first electrical conductive elements and at least one second electrical conductive elements that is connected to said one of first electrical conductive elements so that said one of said first electrical conductive elements is connected to at least two electrical components.

16. The electrical connector housing according to claim 15, wherein said plurality of unit circuits is divided into divisions and mounted in layers, and said electrical parts are mounted sideways of said layers, each of said layers comprising one of said divisions of said plurality of unit circuits, each of said unit circuits being placed in one of the layers without connection between the layers.

17. The electrical connector housing according to claim 16, wherein said at least one of said first and said second electrically conductive elements provided with an insulating film, is formed by one of electrical wires and a flexible printed circuit on which one of copper foils and bare conductive wires are mounted.

18. The electrical connector housing according to claim 17, wherein said first and said second electrically conductive elements are made of an identical material.

19. The electrical connector housing according to claim 15, wherein the first electrically conductive elements are standardized elements having a substantially identical length, and the second electrically conductive elements are configured according to a configuration of a product on which the electrical connector housing is mountable and have a variety of lengths according to distances between said electrical components connected thereto and said first electrically conductive elements to be connected, and wherein said second electrically conductive elements are used after having been cut out into given lengths.

20. The electrical connector housing according to claim 15, wherein each contact position of said first and second electrically conductive elements is connected by at least one of welding, soldering and riveting.

21. An electrical connector housing comprising:
   a plurality of unit circuits made of first electrically conductive elements formed as long thin strips having upper and lower generally flat surfaces and being arranged in parallel at a given interval, each of said first electrically conductive elements connected to electrical parts through second electrically conductive elements;
   said second electrically conductive elements formed as long thin strips having upper and lower generally flat surfaces and being arranged in a direction substantially perpendicular to a direction of said first electrically conductive elements;
   said first and second electrically conductive elements forming intersection faces including contact points between said first and said second electrically conductive elements; and
   wherein said upper surface of said first electrically conductive elements directly contact said lower surface of said second electrically conductive elements at said contact points.

22. An electrical connector housing comprising:
   a plurality of unit circuits made of first electrically conductive elements formed as long thin strips that are standardized elements having substantially identical lengths and arranged in parallel at a given interval, each of said first electrically conductive elements connected to electrical parts through second electrically conductive elements;
   said second electrically conductive elements formed as long thin strips that are arranged in a direction substantially perpendicular to a direction of said first electrically conductive elements and that have a variety of lengths according to distances between said electrical parts and said first electrically conductive elements, said second electrically conductive elements being used after having been cut out into given lengths;
   said first and second electrically conductive elements forming intersection faces including contact points between said first and said second electrically conductive elements, and said first and second electrically conductive elements are electrically connected at the contact points by a press-fit contact blade provided separately from said first and second electrically conductive elements.

23. The electrical connector housing according to claim 22, wherein at least two of the second electrically conductive elements that are respectively connected to the electric components provided on opposite edges of the electrical connector housing, are aligned in a line extending in a direction parallel to the second electrically conductive element.

* * * * *